United States Patent
Kirby

(10) Patent No.: US 7,053,641 B2
(45) Date of Patent: May 30, 2006

(54) INTERCONNECT HAVING SPRING CONTACTS

(75) Inventor: Kyle K. Kirby, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/145,500

(22) Filed: Jun. 6, 2005

(65) Prior Publication Data

US 2005/0225344 A1 Oct. 13, 2005

Related U.S. Application Data

(62) Division of application No. 11/044,941, filed on Jan. 27, 2005, which is a division of application No. 10/379,949, filed on Mar. 6, 2003, now Pat. No. 6,982,565.

(51) Int. Cl.
*G01R 31/02* (2006.01)

(52) U.S. Cl. .................................. 324/755

(58) Field of Classification Search ............. 324/754, 324/758, 760–762, 765, 158.1; 439/482
See application file for complete search history.

(56) References Cited

U.S. PATENT DOCUMENTS

| 5,006,792 A | 4/1991 | Malhi et al. |
| 5,172,050 A | 12/1992 | Swapp |
| 5,286,944 A | 2/1994 | Li |
| 5,378,330 A | 1/1995 | Li et al. |
| 5,419,807 A | 5/1995 | Akram et al. |
| 5,478,779 A | 12/1995 | Akram |
| 5,483,741 A | 1/1996 | Akram et al. |
| 5,487,999 A | 1/1996 | Farnworth |
| 5,519,332 A | 5/1996 | Wood et al. |
| 5,541,525 A | 7/1996 | Wood et al. |
| 5,559,444 A | 9/1996 | Farnworth et al. |
| 5,686,317 A | 11/1997 | Akram et al. |
| 5,716,218 A | 2/1998 | Farnworth et al. |
| 5,756,370 A | 5/1998 | Farnworth et al. |
| 5,781,022 A | 7/1998 | Wood et al. |
| 5,783,461 A | 7/1998 | Hembree |
| 5,815,000 A | 9/1998 | Farnworth et al. |
| 5,869,974 A | 2/1999 | Akram et al. |
| 5,894,161 A | 4/1999 | Akram et al. |

(Continued)

OTHER PUBLICATIONS

Ultrasharp Silicon Cantilevers, MT-MDT SC11 and SC21 series, Ultrasharp Silicon Cantilevers, 1998, pp. 1-2.

(Continued)

*Primary Examiner*—Jermele Hollington
(74) *Attorney, Agent, or Firm*—Stephen A. Gratton

(57) ABSTRACT

An interconnect for testing a semiconductor component includes a substrate, and interconnect contacts on the substrate configured to electrically engage component contacts on the component. The interconnect contacts include flexible spring segments defined by grooves in the substrate, shaped openings in the substrate, or shaped portions of the substrate. The spring segments are configured to flex to exert spring forces on the component contacts, and to compensate for variations in the size or planarity of the component contacts. The interconnect can be configured to test wafer sized components, or to test die sized components. A test method includes the steps of providing the interconnect with the interconnect contacts, and electrically engaging the component contacts under a biasing force from the spring segments. A wafer level test system includes the interconnect mounted to a testing apparatus such as a wafer probe handler. A die level test system includes the interconnect mounted to a test carrier for discrete components.

32 Claims, 7 Drawing Sheets

U.S. PATENT DOCUMENTS

| | | |
|---|---|---|
| 6,005,288 A | 12/1999 | Farnworth et al. |
| 6,025,730 A | 2/2000 | Akram et al. |
| 6,025,731 A | 2/2000 | Hembree et al. |
| 6,040,239 A | 3/2000 | Akram et al. |
| 6,060,891 A | 5/2000 | Hembree et al. |
| 6,064,216 A | 5/2000 | Farnworth et al. |
| 6,068,669 A | 5/2000 | Farnworth et al. |
| 6,072,321 A | 6/2000 | Akram et al. |
| 6,078,186 A | 6/2000 | Hembree et al. |
| 6,091,252 A | 7/2000 | Akram et al. |
| 6,114,240 A | 9/2000 | Akram et al. |
| 6,114,864 A | 9/2000 | Soejima |
| 6,130,148 A | 10/2000 | Farnworth et al. |
| 6,242,931 B1 | 6/2001 | Hembree et al. |
| 6,246,250 B1 | 6/2001 | Doherty et al. |
| 6,263,566 B1 | 7/2001 | Hembree et al. |
| 6,265,245 B1 | 7/2001 | Farnworth et al. |
| 6,275,052 B1 | 8/2001 | Hembree et al. |
| 6,294,837 B1 | 9/2001 | Akram et al. |
| 6,300,782 B1 | 10/2001 | Hembree et al. |
| 6,310,484 B1 | 10/2001 | Akram et al. |
| 6,313,531 B1 | 11/2001 | Geusic et al. |
| 6,359,456 B1 | 3/2002 | Hembree et al. |
| 6,437,591 B1 | 8/2002 | Farnworth et al. |
| 6,448,529 B1 | 9/2002 | Hiraishi et al. |
| 6,498,503 B1 | 12/2002 | Akram et al. |
| 6,529,026 B1 | 3/2003 | Farnworth et al. |
| 6,563,215 B1 | 5/2003 | Akram et al. |
| 6,586,955 B1 | 7/2003 | Fjelstad et al. |
| 6,600,334 B1 | 7/2003 | Hembree et al. |
| 6,670,634 B1 | 12/2003 | Akram et al. |
| 6,708,399 B1 | 3/2004 | Farnworth et al. |
| 6,982,565 B1 * | 1/2006 | Kirby .................. 324/755 |

OTHER PUBLICATIONS

Our Products, Artbeam Super Micro Electro-Discharge Processing Know-How, Matsushita Electric (Panasonic) Co., Ltd., Sep. 26, 2002, pp. 1-3.

Development of a New Electrode Wire for Wire Electro Discharge Machine, SEI NEWS, Jan. 2000, pp. 1-2.

Micromachine Technology (III), Sep. 26, 2002, pp. 1-5.

What is Micro Eleectro-Discharge?, Matsushita Electric Industrial Co., Ltd., Sep. 26, 2002, pp. 1-2.

* cited by examiner

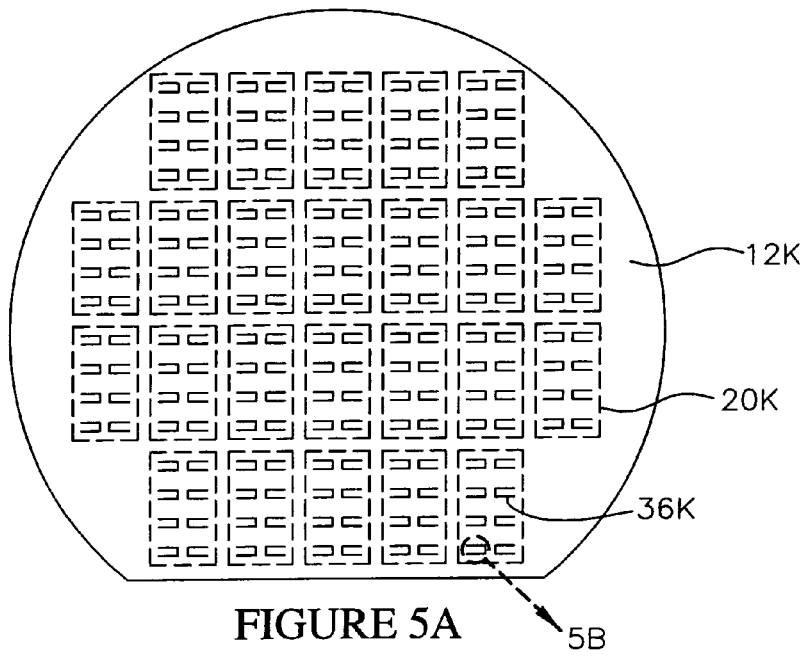
FIGURE 5A
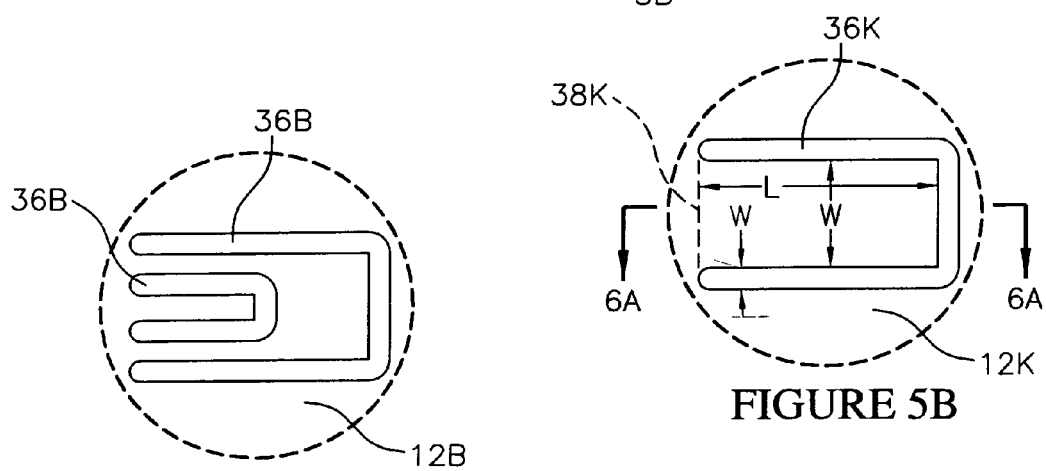
FIGURE 5C
FIGURE 5B
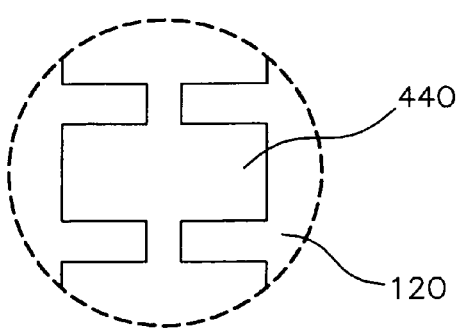
FIGURE 5D

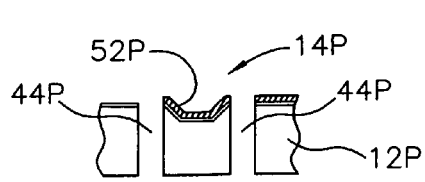
FIGURE 8B
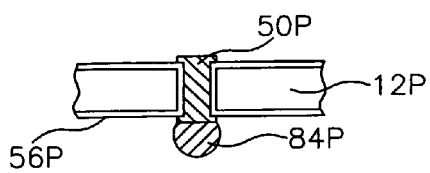
FIGURE 8C
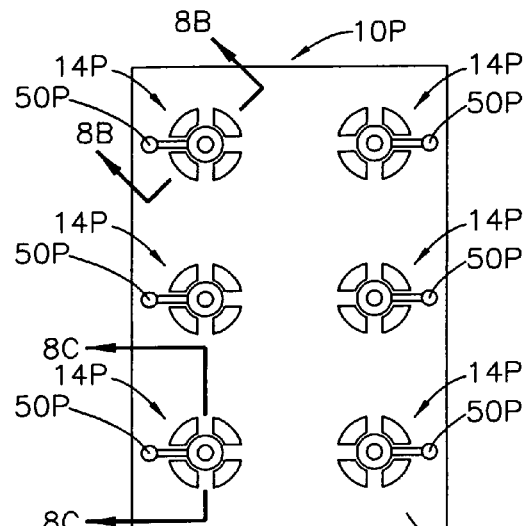
FIGURE 8A
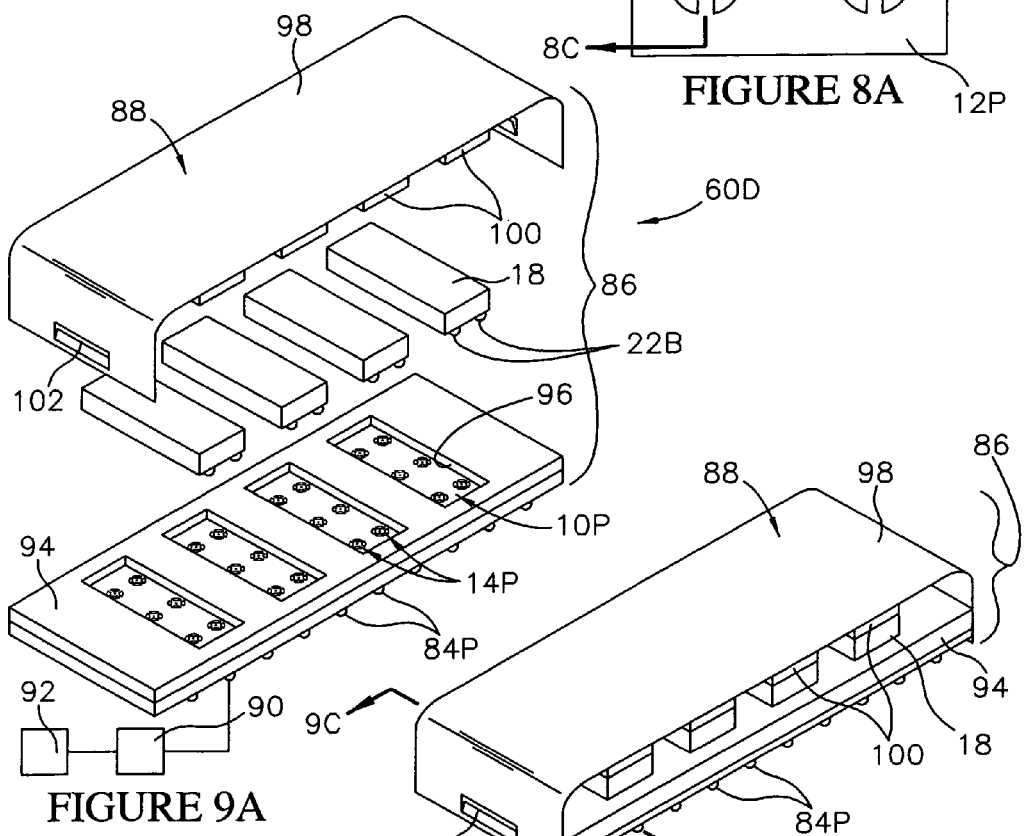
FIGURE 9A
FIGURE 9B
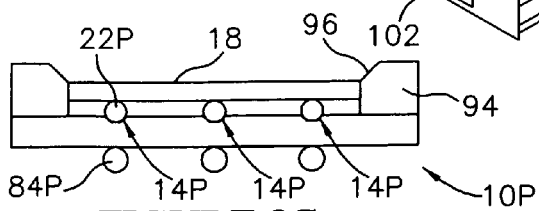
FIGURE 9C

INTERCONNECT HAVING SPRING CONTACTS

CROSS REFERENCE TO RELATED APPLICATIONS

This application is a divisional of U.S. application Ser. No. 11/044,941 filed on Jan. 27, 2005, which is a divisional of U.S. application Ser. No. 10/379,949 filed on Mar. 6, 2003, now U.S. Pat. No. 6,982,565.

FIELD OF THE INVENTION

This invention relates generally to semiconductor manufacture and testing. More particularly, this invention relates to an interconnect for electrically engaging semiconductor components, to test systems incorporating the interconnect and to test methods employing the interconnect.

BACKGROUND OF THE INVENTION

Semiconductor components, such as dice and packages, are typically tested at the wafer level prior to being singulated into separate components. Semiconductor components include patterns of component contacts, such as bond pads, redistribution pads or test pads, which provide electrical connection points for addressing the integrated circuits contained on the components. An interconnect having interconnect contacts can be used to make temporary electrical connections with the component contacts. Test signals are then transmitted through the interconnect contacts and the component contacts, to the integrated circuits contained on the components.

One type of conventional interconnect is a probe card. Probe cards come in several varieties, including needle probe cards and membrane probe cards. A needle probe card, includes a substrate, circuit traces on the substrate, and needle probes soldered to openings in the substrate in electrical communication with circuit traces.

One problem with a conventional needle probe cards is that the planarity and vertical position of the needle probes can vary. These variations can cause inaccuracies in the test results because electrical contact with the component contacts can vary. Continued use of needle probe cards causes wear, deformation and further misalignment of the needle probes.

Membrane probe cards typically include a membrane formed of a thin and flexible dielectric material such as polyimide, and interconnect contacts in the form of metal bumps on the membrane. In general, membrane probe cards are able to compensate for vertical misalignment between the component contacts. However, the manufacturing process for membrane probes is complex and expensive. In addition, support mechanisms for membrane probes are also complicated and can require a large number of moving parts.

Another disadvantage of membrane probe cards is that large contact forces are required to make reliable electrical connections between the metal bumps on the membrane, and the component contacts on the components. These contact forces include a vertical "overdrive" force, and a horizontal "scrubbing" force. These large forces can damage the component contacts and the components. In addition, the metal bumps and the membranes are repeatedly stressed by the large forces, which can cause the membrane to lose its resiliency. Elastomeric members in the support mechanisms can also be compressed and damages with repeated use.

Another type of interconnect for electrically engaging semiconductor components includes semiconductor interconnect contacts having projections for penetrating the component contacts to a limited penetration depth. This type of interconnect is disclosed in U.S. Pat. No. 5,483,741 to Akram et al.; U.S. Pat. No. 5,686,317 to Akram et al., U.S. Pat. No. 5,716,218 to Farnworth et al. and U.S. Pat. No. 6,072,321 to Akram et al.

In view of the deficiencies associated with conventional interconnects, the present invention is directed to an improved interconnect for semiconductor components. The interconnect of the present invention includes semiconductor contacts having an integrally formed spring element. In addition, the present invention is directed to test systems incorporating the interconnect, to test methods performed using the interconnect, and to fabrication methods for fabricating the interconnect.

SUMMARY OF THE INVENTION

In accordance with the present invention, an improved interconnect for semiconductor components, test systems incorporating the interconnect, a method for testing semiconductor components using the interconnect, and a method for fabricating the interconnect are provided.

The interconnect can be configured to test wafer sized components, such as semiconductor wafers containing dice or packages, or to test die sized components, such as singulated dice or packages. The interconnect includes a substrate, a plurality of interconnect contacts on the substrate for electrically engaging component contacts on the components, and a plurality of conductors on the substrate for electrically connecting the interconnect contacts to test circuitry.

The interconnect contacts include spring segments, and conductive bumps on the spring segments in electrical communication with the conductors. In an illustrative embodiment, the substrate comprises a semiconductor material, and the spring segments comprise flexible segments of the substrate defined by grooves or openings in the substrate. The spring segments are configured to flex to exert spring forces on the component contacts, and to compensate for variations in the size or planarity of the component contacts.

A wafer level test system includes test circuitry, a wafer prober, and a wafer sized interconnect mounted to the wafer prober in electrical communication with the test circuitry. A die level test system includes test circuitry, a test carrier configured to retain discrete semiconductor components, such as bare dice and packages, and a die sized interconnect mounted to the test carrier in electrical communication with the test circuitry.

A method for testing the components includes the steps of providing the interconnect with the interconnect contacts, biasing the interconnect contacts against the component contacts using a spring force generated by the spring segments, and applying test signals through the interconnect contacts and the component contacts to the components.

A method for fabricating the interconnect includes the steps of providing a semiconductor substrate, and micromachining or etching openings in the substrate to define spring segments having a selected shape and spring constant.

BRIEF DESCRIPTION OF THE DRAWINGS

FIG. 5A is a schematic plan view of a semiconductor substrate used for fabricating the wafer level interconnect;

FIG. 5B is an enlarged schematic plan view taken along line 5B of FIG. 5A illustrating a groove formed in the substrate during fabrication of the interconnect contact of FIG. 3 or 3B;

FIG. 5C is an enlarged schematic plan view equivalent to FIG. 5B illustrating grooves formed in the substrate during fabrication of the interconnect contact of FIG. 2A or 2B;

FIG. 5D is an enlarged schematic plan view equivalent to FIG. 5B illustrating an opening formed in the substrate during fabrication of the interconnect contacts of FIG. 4;

FIG. 8A is an enlarged schematic plan view of a die level interconnect constructed in accordance with the invention;

FIG. 8B is an enlarged schematic cross sectional view taken along section line 8B—8B of FIG. 8A illustrating an interconnect contact on the die level interconnect;

FIG. 8C is an enlarged schematic cross sectional view taken along section line 8C—8C of FIG. 8A illustrating a conductive via and terminal contact of the die level interconnect;

FIG. 9A is a schematic perspective view of a die level test system incorporating the die level interconnect of FIG. 8A;

FIG. 9B is a schematic perspective view of a test carrier of the die level test system in a closed position; and FIG. 9C is a cross sectional view with parts removed taken along section line 9C—9C of FIG. 10B illustrating the die level interconnect of the test system electrically engaging a component.

DETAILED DESCRIPTION OF THE PREFERRED EMBODIMENT

As used herein, the term "semiconductor component" refers to an electronic component that includes a semiconductor die. Exemplary semiconductor components include semiconductor wafers, semiconductor dice, semiconductor packages, and BGA devices.

The term "wafer level fabrication method" means a semiconductor fabrication method in which semiconductor wafers are used to make semiconductor components.

Referring to FIGS. 1A–1B, FIG. 2 and FIG. 3, a wafer level interconnect 10 constructed in accordance with the invention is illustrated. The interconnect 10 is configured to test a semiconductor wafer 16 (FIG. 7B) containing a plurality of semiconductor components 18 (FIG. 7B), such as dice or packages. In addition, the interconnect 10 is configured to electrically engage all of the components 18 (FIG. 7B) on the wafer 16 (FIG. 7B) at the same time. However, the interconnect 10 can also be configured to electrically engage one component 18 (FIG. 7B) on the wafer 16 (FIG. 7B) at a time, or clusters of two or more components 18 on the wafer 16 (FIG. 7B) at a time. The interconnect 10 can also be configured to test other wafer sized components, such as leadframes, strips, or panels containing multiple semiconductor components. Further, as will be further explained, a die level interconnect 10D (FIG. 8A) can be configured to test singulated components 18, such as dice or packages.

Figure 1A:
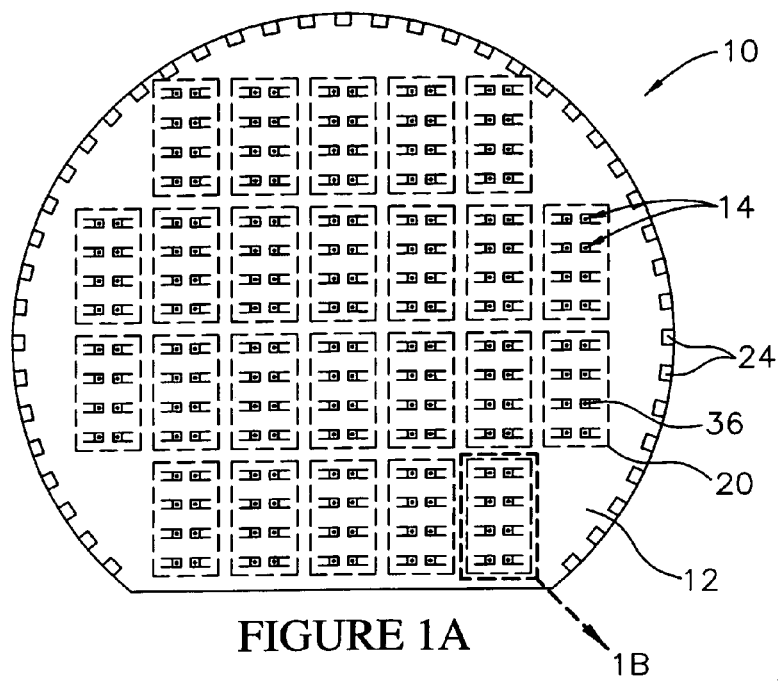
FIG. 1A is a schematic plan view of a wafer level interconnect constructed in accordance with the invention.

As shown in FIG. 1A, the interconnect 10 includes a substrate 12, and a plurality of patterns 20 of contacts 14 on the substrate 12. In the illustrative embodiment, the substrate 12 comprises a semiconductor material such as silicon, silicon-on-sapphire, silicon-on-glass, gallium arsenide, or germanium. Alternately, the substrate 12 can comprise another machineable or etchable material such as ceramic or plastic.

Figure 7A:
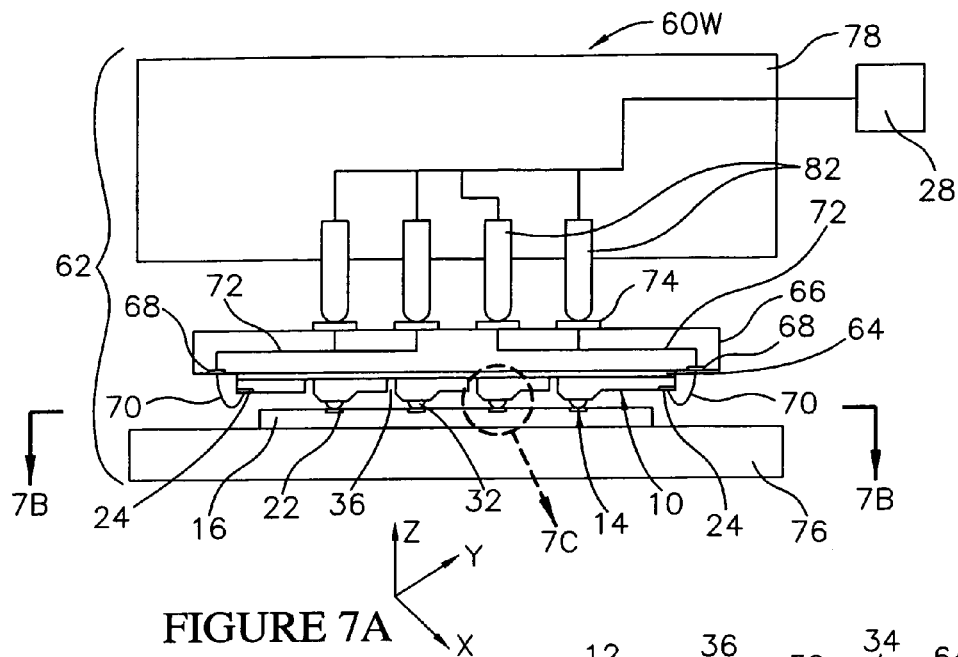
FIG. 7A is a schematic cross sectional view of a wafer level test system incorporating the wafer level interconnect of FIG. 1A.
Figure 7B:
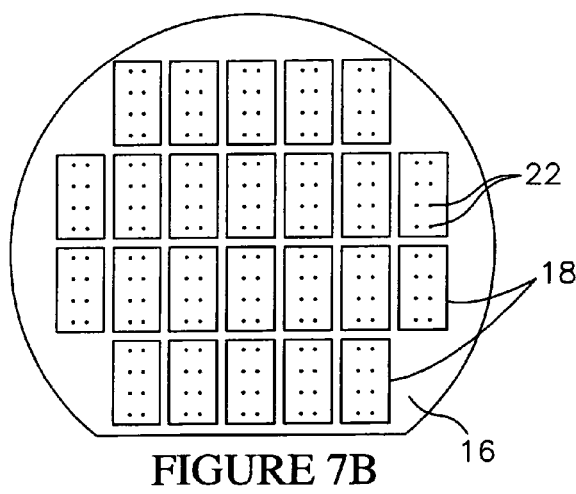
FIG. 7B is a schematic cross sectional view of a semiconductor wafer under test by the test system taken along section line 7B—7B of FIG. 7A.

The contacts 14 on the substrate 12 are adapted to electrically engage component contacts 22 (FIG. 7B), such as bond pads, redistribution pads, or terminal contacts, on the components 18 (FIG. 7B) contained on the wafer 16 (FIG. 7B). In FIG. 1A, each pattern 20 of contacts 14 is denoted by dotted lines having outlines corresponding to the outlines of the components 18 on the wafer 16. The interconnect 10 also includes a plurality of conductors 26 in electrical communication with the interconnect contacts 14. In addition, the interconnect 10 includes a plurality of edge contacts 24 in electrical communication with the interconnect contacts 14, and configured for electrical communication with a test circuitry 28 (FIG. 7A).

Figure 3:
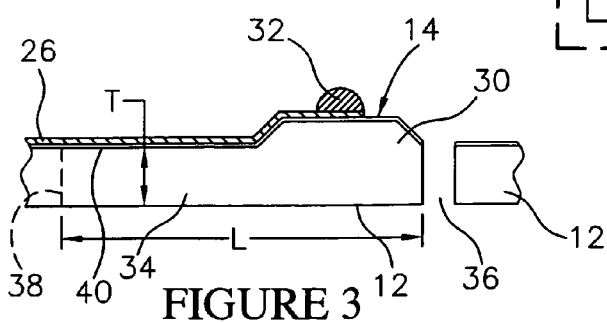
FIG. 3 is an enlarged schematic cross sectional view of the interconnect contact taken along section line 3—3 of FIG. 1B.

As shown in FIG. 3, each interconnect contact 14 includes a conductive bump 32, and a conductor in electrical communication with the conductive bump 32. Each interconnect contact 14 also includes a spring segment 34, which comprises a portion of the substrate 12 defined by a groove 36 in the substrate 12. In addition, each spring segment includes a pyramidal shaped raised portion 30 on a terminal end thereof on which the conductive bump 32 is formed. As used herein, the term "groove" refers to a through opening in the substrate 12 having a width substantially less than a length thereof. This geometry permits the grooves 36 to be shaped to provide a desired shape and spacing for the spring segments 34. In the illustrative embodiment of the interconnect contact 14 each groove 36 is generally C-shaped, but with the C rotated 180°.

The conductive bumps 32 can comprise a wear resistant metal, such as nickel, copper, beryllium copper, or alloys thereof. The conductive bumps 32 can also comprise another metal or metal alloy used in semiconductor manufacture, such as a solder alloy. In addition, the conductive bumps 32 can comprise a single layer of metal or multiple layers, such as an adhesion layer (e.g., nickel) and a non-oxidizing layer (e.g., gold). Further, the conductive bumps 32 can have a rough textured surface configured to penetrate the component contacts 22. U.S. Pat. No. 5,487,999 to Farnworth et al. which is incorporated herein by reference discloses a method for fabricating contact bumps with a rough textured surface. As another alternative, the conductive bumps 32 can comprise a conductive polymer material, or a conductive polymer material containing particles, such as metal or diamond, configured to penetrate the component contacts 22 (FIG. 8B) during electrical engagement.

In the illustrative embodiment, the conductive bumps 32 are generally hemishperically shaped bumps configured to electrically engage planar component contacts 22. However, the conductive bumps 32 can have another shape, such as a cylindrical, pointed, blade, spherical, pyramidal, pin, spring, concave, convex or hollow shape.

The conductors 26 can comprise a highly conductive metal capable of deposition using semiconductor circuit fabrication techniques, such as electroless deposition, CVD, electrolytic deposition, sputtering, etching, screen printing or stenciling. Suitable metals include aluminum, chromium, titanium, nickel, iridium, copper, gold, tungsten, silver, platinum, palladium, tantalum, molybdenum and alloys of these metals. In addition, the conductors 26 can comprise a single layer of metal, or a multi layered stack of metals. The edge contacts 24 can comprise a same metal as the conductors 26, or a wear resistant metal, such as nickel, copper, beryllium copper, or alloys thereof.

The interconnect 10 also includes an electrically insulating layer 40 on the surface of the substrate 12, configured to electrically insulate the conductive bumps 32, and the conductors 26, from the bulk of the substrate 12. As will be further explained, the insulating layer 40 can comprise a polymer, such as parylene or polyimide, or an oxide such as silicon dioxide.

Figure 2:
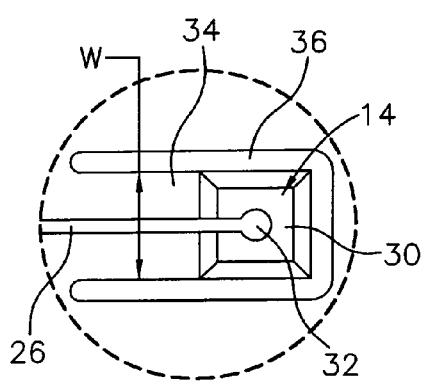
FIG. 2 is an enlarged schematic plan view taken along line 2 of FIG. 1B illustrating an interconnect contact on the wafer level interconnect.
Figure 1B:
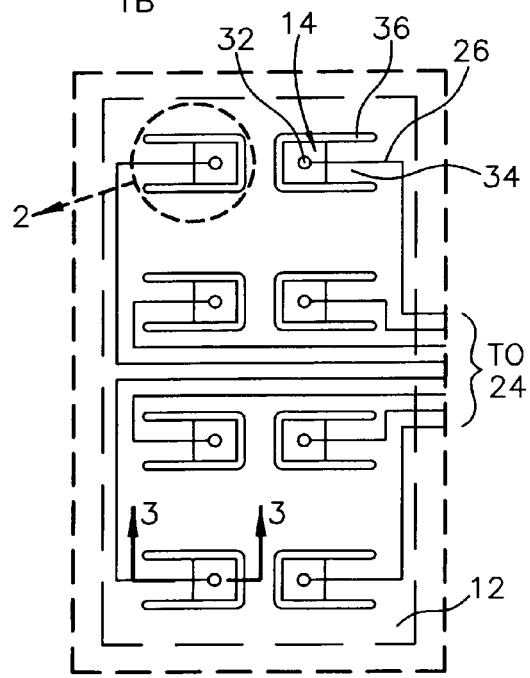
FIG. 1B is an enlarged schematic plan view taken along line 1B of FIG. 1A illustrating an array of interconnect contacts on the wafer level interconnect.
Figure 7C:
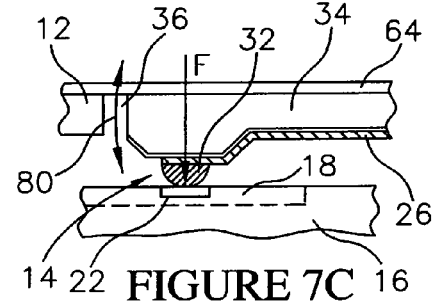
FIG. 7C is an enlarged schematic cross sectional view taken along line 7C of FIG. 7A illustrating an interconnect contact on the wafer level interconnect of the test system electrically engaging a component contact on the wafer.
Figure 7D:
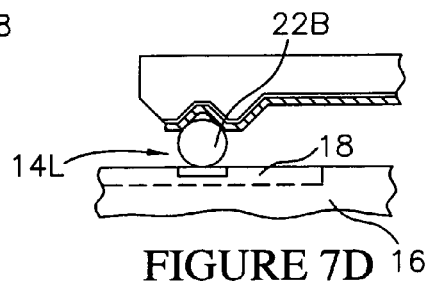
FIG. 7D is an enlarged schematic cross sectional view equivalent to FIG. 7C illustrating the alternate embodiment interconnect contact of FIG. 3C electrically engaging a bumped component contact on the wafer.

As shown in FIG. 3, the spring segments 34 have a selected thickness T, a selected length L, and a selected width W (FIG. 2). The thickness T, the length L, and the width W of the spring segments 34 can be selected to achieve a desired spring constant C. In addition, these parameters can be related by the formula: $C = E \times W \times T^3 / L^4$, where E is the modulus of elasticity of the substrate 12. During a test procedure using the interconnect 10 the spring segments 34 exert a spring force F (FIG. 7D) corresponding to the spring constant C, which biases the conductive bumps 32 against the component contacts 22 (FIG. 7D).

As shown in FIG. 2, the spring segments 34 are separated on three sides from adjacent portions of the substrate 12 by the grooves 36 in the substrate 12. In addition, the spring segments 34 have a hinge point 38 on the substrate 36 denoted by the dotted line in FIG. 3. Further, the terminal ends of the spring segments 34 proximate to the groove 36 are shaped to form the raised portions 30. Further characteristics of the spring segments 34 and grooves 36 will become more apparent as the description proceeds.

Figure 2A:
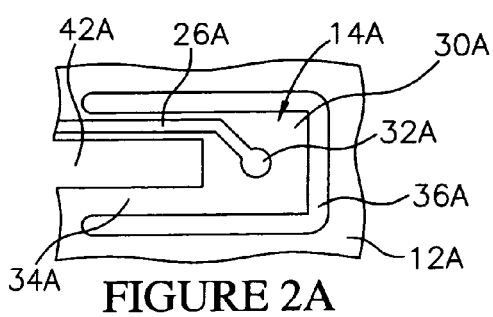
FIGS. 2A–2I are enlarged schematic plan views equivalent to FIG. 2, each illustrating an alternate embodiment interconnect contact.

Referring to FIG. 2A, an alternate embodiment interconnect contact 14A includes a raised portion 30A, a conductive bump 32A on the raised portion 30A, and a conductor 26A in electrical communication with the conductive bump 32A. The interconnect contact 14A also includes a bifurcated spring segment 34A defined by a groove 36A, and a generally rectangular shaped opening 42A in the substrate 12A. The bifurcated spring segment 34A attaches the raised portion 30A to the remainder of the substrate 12A, and allows the raised portion 30A to flex and bias the conductive bump 32A against a component contact 22 (FIG. 7C). As with the groove 36 (FIG. 2), the groove 36A is generally C shaped, but with the C rotated 180°.

Figure 2E:
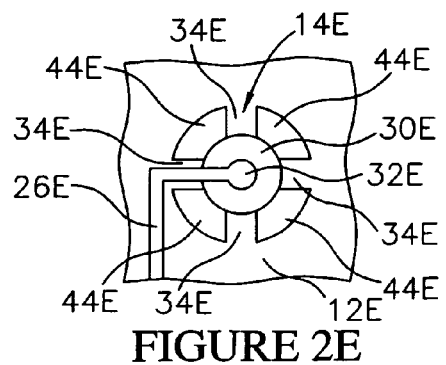
Figure 2B:
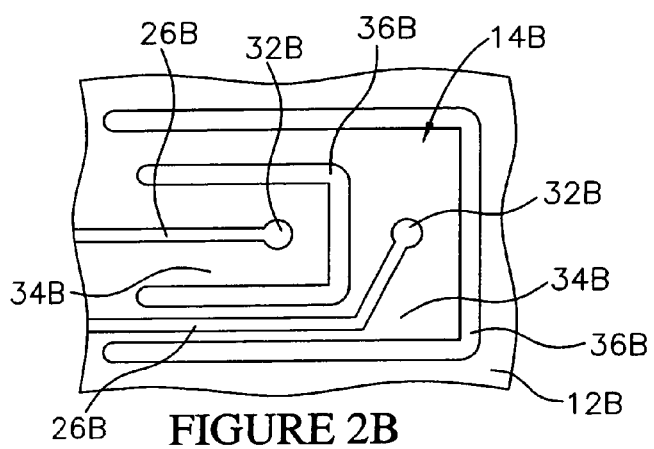

Referring to FIG. 2B, an alternate embodiment interconnect contact 14B includes a pair of conductive bumps 32B, and a pair of conductors 26B in electrical communication with the conductive bumps 32B. The interconnect contact 14B also includes a pair of nested spring segments 34B defined by a pair of nested grooves 36B ("first groove" and "second groove" in the claims) in the substrate 12B. Again the grooves 36B are generally C shaped, but with the C rotated 180°. In addition, the smaller groove 36B has a length that is less than the length of the larger groove 36B. For example, the length of the smaller groove 36B can be from 0.25 to 0.75 the length of the larger groove 36B.

Figure 2F:
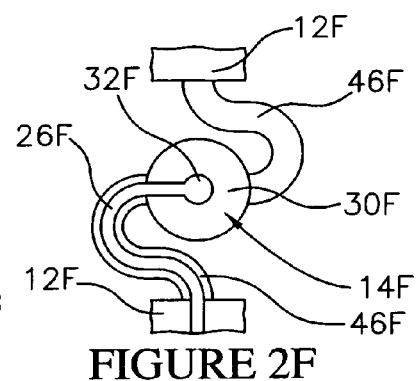
Figure 2C:
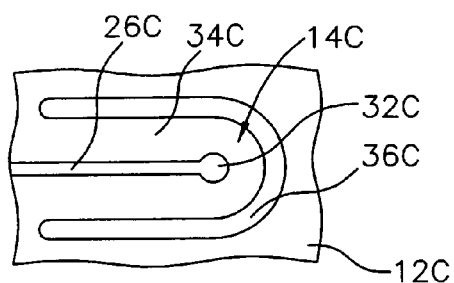

Referring to FIG. 2C, an alternate embodiment interconnect contact 14C includes a conductive bump 32C and a conductor 26C in electrical communication with the conductive bump 32C. The interconnect contact 14C also includes a spring segment 34C defined by a groove 36C in the substrate 12C. The groove 36C has a rounded terminal portion such that the spring segment 34C also has a rounded terminal portion. As with the groove 36 (FIG. 2), the groove 36C is generally C-shaped, but with the C rotated 180°.

Figure 2G:
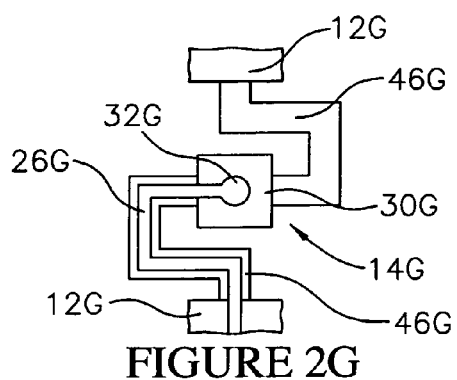
Figure 2D:
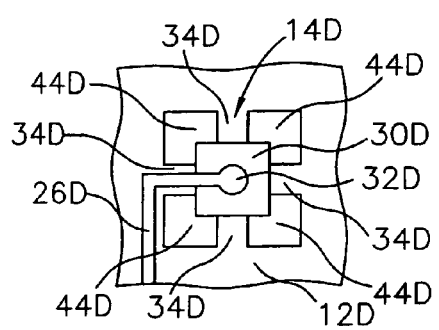

Referring to FIG. 2D, an alternate embodiment interconnect contact 14D includes a raised portion 30D, a conductive bump 32D on the raised portion 30D, and a conductor 26D in electrical communication with the conductive bump 32D. The interconnect contact 14D also includes four spring segments 34D defined by four generally square shaped openings 44D in the substrate 12D. As used herein the term shaped opening refers to an opening through the substrate 12D having a width that is about the same size as a width thereof. The spring segments 34D attach the raised portion 30D to the remainder of the substrate 12D and allow the raised portion 30D to flex to bias the conductive bump 32D against a component contact 22 (FIG. 7C).

Referring to FIG. 2E, an alternate embodiment interconnect contact 14E includes a raised portion 30E, a conductive bump 32E on the raised portion 30E, and a conductor 26E in electrical communication with the conductive bump 32E. The interconnect contact 14E also includes four spring segments 34E defined by four arcuate shaped openings 44E in the substrate 12E. The spring segments 34E attach the raised portion 30E to the remainder of the substrate 12E and allow the raised portion 30E to flex to bias the conductive bump 32E against a component contact 22 (FIG. 7C).

Referring to FIG. 2F, an alternate embodiment interconnect contact 14F includes a raised portion 30F, a conductive bump 32F on the raised portion 30F, and a conductor 26F in electrical communication with the conductive bump 32F. The interconnect contact 14E also includes at least two shaped spring segments 46F which comprise serpentine shaped portions of the substrate 12F. The shaped spring segments 46F attach the raised portion 30F to the remainder of the substrate 12F and allow the raised portion 30F to flex to bias the conductive bump 32F against a component contact 22 (FIG. 7C). One of the shaped spring segments 46F also supports the conductor 26F.

Referring to FIG. 2G, an alternate embodiment interconnect contact 14G includes a raised portion 30G, a conductive bump 32G on the raised portion 30G, and a conductor 26G in electrical communication with the conductive bump 32G. The interconnect contact 14G also includes at least two shaped spring segments 46G which comprise orthogonally shaped portions of the substrate 12G. The shaped spring segments 46G attach the raised portion 30G to the remainder of the substrate 12G and allow the raised portion 30G to flex to bias the conductive bump 32G against a component contact 22 (FIG. 7C). One of the shaped spring segments 46G also supports the conductor 26G.

Figure 2H:
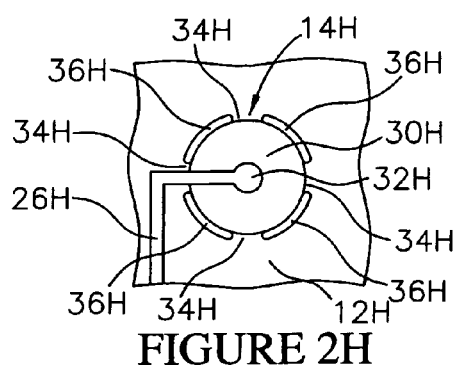

Referring to FIG. 2H, an alternate embodiment interconnect contact 14H includes a raised portion 30H, a conductive bump 32H on the raised portion 30H, and a conductor 26H in electrical communication with the conductive bump 32H. The interconnect contact 14H also includes four spring segments 34H defined by four arcuate shaped grooves 36H in the substrate 12H. As used herein the term "arcuate shape" means having a curved or radiused shape. The spring segments 34H attach the raised portion 30H to the remainder of the substrate 12H and allow the raised portion 30H to flex to bias the conductive bump 32H against a component contact 22 (FIG. 7C).

Figure 2I:
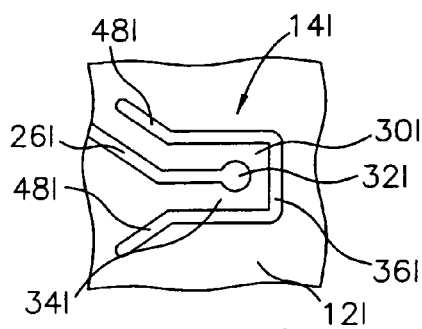

Referring to FIG. 2I, an alternate embodiment interconnect contact 14I includes a conductive bump 32I and a conductor 26I in electrical communication with the conductive bump 32I. The interconnect contact 14I also includes a spring segment 34I defined by a groove 36I in the substrate 12I. The groove 36I also includes outwardly flared terminal portions 48I one of which is generally parallel to a conductor 26I.

Figure 3C:
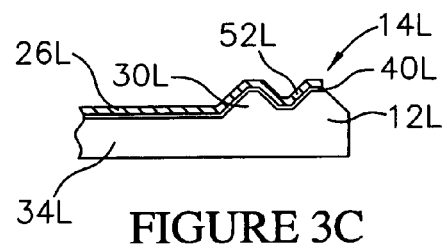
FIGS. 3A–3E are enlarged schematic cross sectional views equivalent to FIG. 3, each illustrating an alternate embodiment interconnect contact.
Figure 3A:
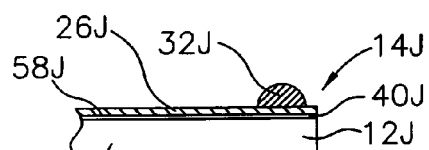

Referring to FIG. 3A, an alternate embodiment interconnect contact 14J includes a conductive bump 32J and a conductor 26J in electrical communication with the conductive bump 32J. The interconnect contact 14J also includes a spring segment 34J formed as a portion of a substrate 12J and an insulating layer 40J on the substrate 12J. The interconnect contact 14J is substantially similar to the interconnect contact 14 (FIG. 3) but does not include the raised portion 30 (FIG. 3). Rather a front side 58J (circuit side) of the substrate 12J is planar and the conductive bump 32J is formed thereon.

Figure 3D:
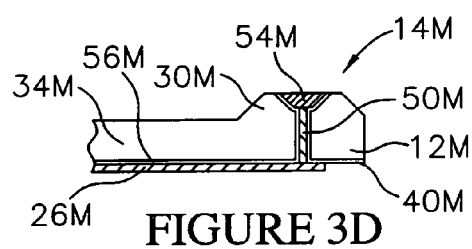
Figure 3B:
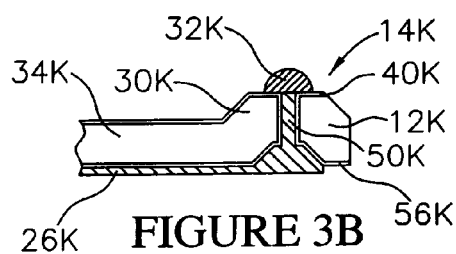

Referring to FIG. 3B, an alternate embodiment interconnect contact 14K includes a raised portion 30K and a conductive bump 32K on the raised portion 30K. The interconnect contact 14K also includes a spring segment 34K formed as a portion of a substrate 12K and an insulating layer 40K on the substrate 12K. The interconnect contact 14K is substantially similar to the interconnect contact 14 (FIG. 3), but also includes a conductive via 50K in the substrate 12K in electrical communication with the conductive bump 32K. In addition, the interconnect contact 14K includes a conductor 26K on a back side 56K of the substrate 12K in electrical communication with the conductive via 50K. The conductive via 50K allows electrical connections to be made to the back side 56K.

Figure 7E:
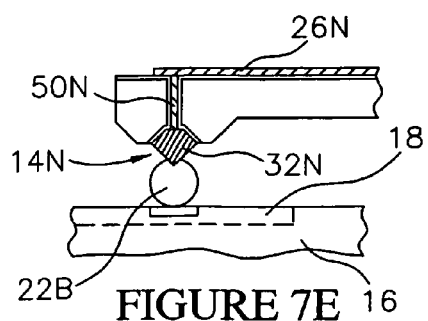
FIG. 7E is an enlarged schematic cross sectional view equivalent to FIG. 7C illustrating the alternate embodiment interconnect contact of FIG. 3E electrically engaging a bumped component contact on the wafer.

Referring to FIG. 3C, an alternate embodiment interconnect contact 14L includes a raised portion 30L and a plated recess 52L on the raised portion 30K. The plated recess 52L is configured to retain and electrically engage a bumped component contact 22B (FIG. 7E). The interconnect contact 14L also includes a spring segment 34L formed as a portion of a substrate 12L and an insulating layer 40L on the substrate 12L. The interconnect contact 14L is substantially similar to the interconnect contact 14 (FIG. 3), but also includes the plated recess 52L rather than the conductive bump 32.

Referring to FIG. 3D, an alternate embodiment interconnect contact 14M includes a raised portion 30M, and a metal filled recess 54M on the raised portion 30M. The metal filled recess 54M is configured to electrically engage a bumped component contact 22B (FIG. 7E). The interconnect contact 14M also includes a spring segment 34M formed as a portion of a substrate 12M, and an insulating layer 40M on the substrate 12M. In addition, the interconnect contact 14M includes a conductive via 50M in electrical communication with the metal filled recess 54M, and a conductor 26M on a back side 56M of the substrate 12M in electrical communication with the conductive via 50M.

Figure 3E:
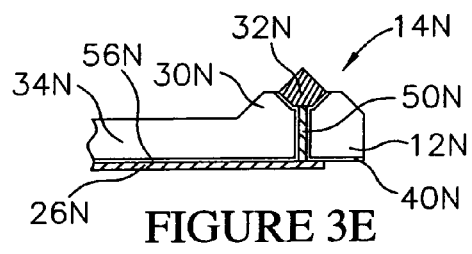

Referring to FIG. 3E, an alternate embodiment interconnect contact 14N includes a raised portion 30N, and a conductive bump 32N on the raised portion 30N. The conductive bump 32N is shaped as a pointed projection or as a blade and is configured to penetrate a bumped component contact 22B (FIG. 7E). The interconnect contact 14N also includes a spring segment 34N formed as a portion of a substrate 12N, and an insulating layer 40N on the substrate 12N. In addition, the interconnect contact 14N includes a conductive via 50N in electrical communication with the conductive bump 32N, and a conductor 26N on a back side 56N of the substrate 12N in electrical communication with the conductive via 50N.

Figure 4:
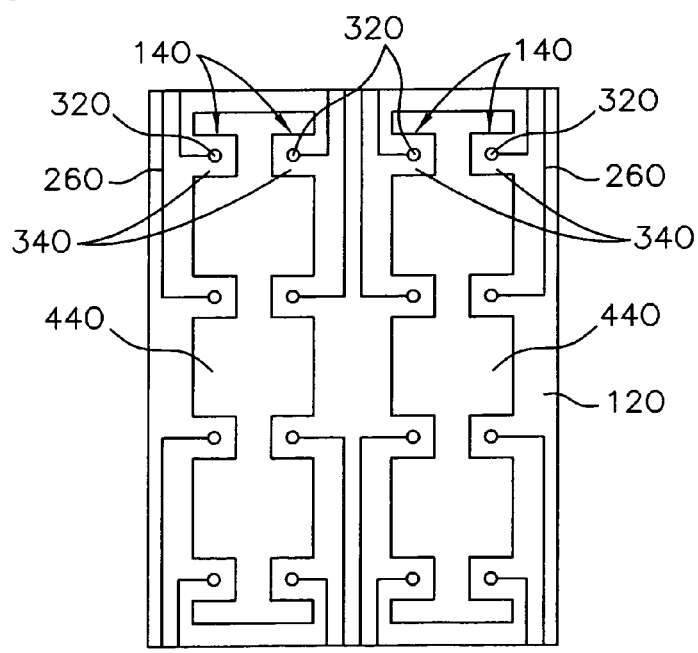
FIG. 4 is an enlarged schematic plan view equivalent to FIG. 1B illustrating alternate embodiment interconnect contacts.

Referring to FIG. 4, alternate embodiment interconnect contacts 14O are substantially similar to the interconnect contact 14 (FIG. 3), and include spring segments 34O, conductive bumps 32O and conductors 26O. However, in this case the spring segments 34O are defined by shaped openings 44) in the substrate 12O, which extend across several pairs of contacts 14O rather than just around one contact 14 (FIG. 3). The shaped openings 44O have a generally tooth like configuration with generally square shaped intermediate portions. In the illustrative embodiment each shaped opening defines four separate pairs of interconnect contacts 14O.

Referring to FIGS. 5A–5B and 6A–6F, steps in a method for fabricating the interconnect 10 (FIG. 1A) are illustrated. In the illustrative embodiment of the fabrication method illustrated in FIGS. 5A–5B and 6A–6F, the interconnect 10 is fabricated with interconnect contacts 14K (FIG. 3B). However, similar fabrication steps can be used to fabricate any of the other embodiments of the interconnect contacts 14, 14A–14P.

Initially, as shown in FIG. 5A, the substrate 12K is provided. For example, the substrate 12K can comprise a blank silicon wafer having a desired peripheral outline and thickness. Preferably, the peripheral outline of the substrate 12K is substantially similar or identical, to that of the semiconductor wafer 16 (FIG. 7B) being tested.

As shown in FIG. 5A, the grooves 36K are initially formed in the substrate 12K for the different patterns 20K of interconnect contacts 14K. The size and shape of the grooves 36K help define the size and shape of the spring segments 34K (FIG. 3B) for the interconnect contacts 14K (FIG. 3B). In particular, as shown in FIG. 5B, the grooves 36K define the length L, the width W, and the hinge point 38K for the spring segments 34K (FIG. 6F).

The grooves 36K can be formed using a micromachining process, such as micro electro-discharge machining, laser machining or etching. Electro-discharge machining melts, and then splashes the work opposite an electrode tool by sparking between the work and the tool. Typically, both the work and the tool are immersed in an insulating liquid such as deionized water. With dielectric breakdown, sparking occurs, melting the work, vaporizing the liquid, and instantly splashing a molten section of the work. One advantage of electro-discharge machining is that there is no contact or force applied to the work. In addition, micron sized features can be machined with high precision.

One suitable apparatus for performing electro-discharge machining of the substrate 12K is disclosed in U.S. Pat. No. 6,448,529 B1 to Hiraishi et al., which is incorporated herein by reference. In addition, electro-discharge machining apparatus are commercially available from Matsushita Research Institute Tokyo, Inc. of Kawasaki, Japan. Further, U.S. Pat. No. 5,378,330 to Li et al., and U.S. Pat. No. 5,286,944 to Li, both of which are incorporated herein by reference, disclose electro-discharge machining methods. By way of example, with electro-discharge machining, the grooves 36K can extend completely through the substrate and have a width WG (FIG. 5B) of from about 5 to 50 µm.

In addition, the length of the grooves 36K, which corresponds to the length L of the spring segments 34, can be on the order of 100 to 800 µm. The length of the grooves 36K is thus from 2 to 160 times greater than the width of the grooves 36K. In general, the length of the grooves 36K will be limited by the pitch of the component contacts 22, because each component contact 14K must be dimensioned to not interfere with an adjacent component contact 14K. In addition, the width WG of the grooves 14K can be much less than the pitch of the component contacts 22. For example, component contacts 22 typically have a pitch or center to center spacing of at least 200 µm. On the other hand, the grooves 36K can have a width WG of from 5 to 50 µm such that the width WG is from 0.0025 to 0.25 of the pitch of the component contacts 22.

The grooves 36K can also be formed using a laser machining process. A suitable laser system for performing the laser machining step is manufactured by Electro Scientific, Inc., of Portland, Oreg. and is designated a Model No. 2700. A representative laser fluence for forming the grooves 36K through a silicon substrate having a thickness of about 28 mils (725 µm), is from 2 to 10 watts/per groove at a pulse duration of 20–25 ns, and at a repetition rate of up to several thousand per second. The wavelength of the laser beam can be a standard UV wavelength (e.g., 355 nm). By way of example, with laser machining, the width of the grooves 36K can be from about 10 µm to 50 µm.

The grooves 36K can also be formed using an etching process, such as a wet etch process, a dry etch process or a plasma etching process. For example, with wet etching a mask, such as a hard mask or a photomask, can be formed on the substrate 12K with openings corresponding in size and location to the grooves 36K. The substrate 12K can then be etched through the openings to form the grooves 36K. With the substrate 12K comprising silicon, suitable wet etchants include TMAH (tetramethylammoniumhydroxide) and KOH (potassium hydroxide).

In general, electro-discharge machining, laser machining or etching techniques, can be used to form grooves or shaped openings which define spring segments, for any of the described embodiments of the interconnect contacts 14, 14A–14P. For example, as shown in FIG. 5C, electro-discharge machining, laser machining or etching techniques, can be used to form the nested grooves 36B in substrate 12B for interconnect contacts 14B (FIG. 2B). As another example, as shown in FIG. 5D, electro-discharge machining, laser machining or etching techniques, can be used to form the opening 44O in the substrate 12O for interconnect contacts 14O (FIG. 4).

Similarly, electro-discharge machining, laser machining or etching techniques can be used to form the shaped spring segments 46F (FIG. 2F) for the interconnect contacts 14F (FIG. 2F), and the shaped spring segments 14G (FIG. 2G) for the interconnect contacts 14G (FIG. 2G).

Figure 6A:
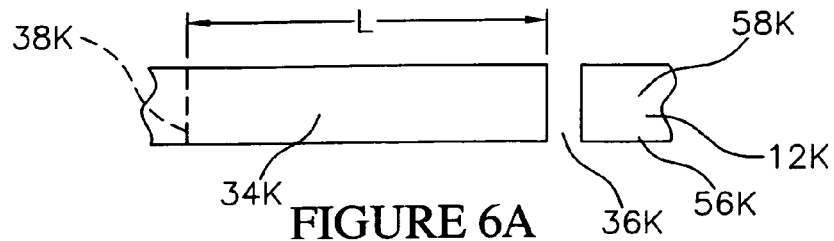
FIG. 6A is an enlarged cross sectional view taken along section line 6A—6A of FIG. 5B.
Figure 6B:
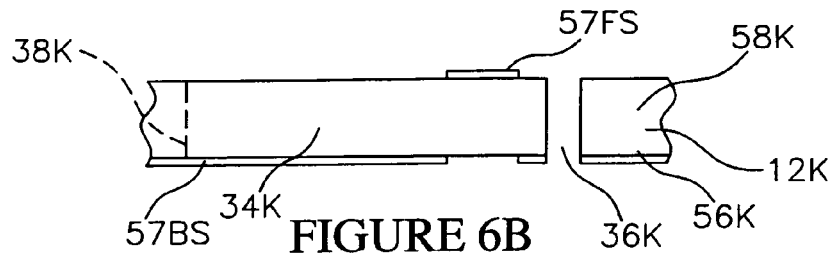
FIGS. 6B–6F are enlarged cross sectional views equivalent to FIG. 6A illustrating steps in a method for fabricating the interconnect contact of FIG. 3B.

Following forming of the grooves 36K, and as shown in FIG. 6B, a front side mask 57FS is formed on the circuit side 58K of the substrate 12K, and a back side mask 57BS is formed on the back side 56K of the substrate 12K. The front side mask 57FS and the back side mask 57BS can comprise hard masks formed of a material such as $Si_3N_4$ (silicon nitride) deposited using a suitable process such as CVD, and then patterned as required.

Figure 6C:
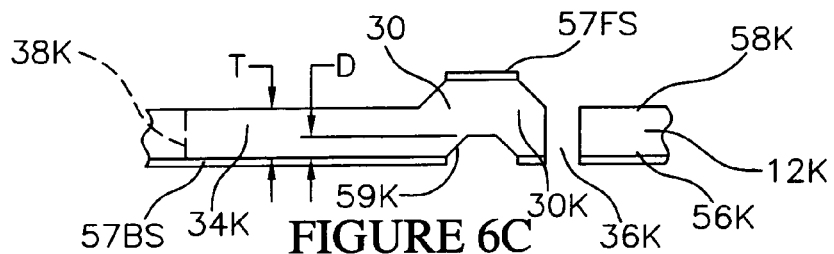

Next, as shown in FIG. 6C, an etching step is performed to thin the substrate 12K, such that the spring segments 34K have a desired thickness T. A representative range for the thickness T can be from 100 µm to 600 µm. The etching step can be performed using a wet etch process, a dry etch process or a plasma etch process. For example, a wet etch process can be performed using a wet etchant such as TMAH (tetramethylammoniumhydroxide) or KOH (potassium hydroxide). The etching step also defines the raised portions 30K on the circuit side 58K of the substrate 12K, and recesses 59K on the back side 56K of the substrate 12K aligned with the raised portions 30K. The raised portions 30K have a height H, and the recesses 59K have a depth D, which are equal to the amount of material removed by the etching step. In addition, the raised portions 30K comprise portions of the substrate 12K having a thickness equal to the original thickness of the substrate 12K prior to the etching step. Following the etching step the back side mask 57BS and the front side mask 57FS are removed using a suitable stripper such as $H_3PO_4$.

Rather than etching the substrate 12K, thinning can be accomplished using a mechanical planarization apparatus (e.g., a grinder). One suitable mechanical planarization apparatus is manufactured by Okamoto, and is designated a model no. VG502. As another alternative, thinning can be performed using a chemical mechanical planarization (CMP) apparatus. Suitable CMP apparatus are commercially available from manufacturers such as Westech, SEZ, Plasma Polishing Systems, or TRUSI.

Figure 6D:
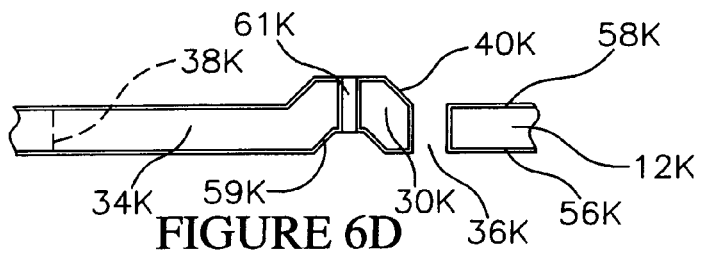

Next, as shown in FIG. 6D, openings 61K for the conductive vias 50K (FIG. 6E) are formed in the substrate 12K. One method for forming the openings 61K is by laser machining the substrate. A suitable laser system for performing the laser machining step is manufactured by Electro Scientific, Inc., of Portland, Oreg. and is designated a Model No. 2700. The openings 61K can also be formed by etching the substrate substantially as previously described. A diameter of the openings can be selected as required with from 10 µm to 50 µm being representative.

As also shown in FIG. 6D, the insulating layers 40K are formed on the inside diameters of the openings 61K, on the back side 56K of the substrate 12K, and optionally on the front side 58K of the substrate 12K. The insulating layers 40K can be a grown or a deposited material. For example, the insulating layers 40K can comprise a parylene polymer deposited from the vapor phase by a process similar to vacuum metallization at pressures of about 0.1 torr. The parylene polymer uniformly coat all exposed surfaces of the substrate 12K to form the insulating layers 40K. A thickness range for the insulating layer 40K can be from 0.10 to 76 µm or greater. Suitable polymers include parylene C, parylene N, and parylene D. Parylene is available from Advanced Coating of Tempe, Ariz.

In addition, a suitable parylene product is available from Specialty Coating Systems, of Indianapolis, Ind., and is designated parylene "VIPAF-4". A suitable deposition apparatus for depositing parylene polymers is a portable parylene deposition system, designated a "Model PDS 2010 LAB-COATER 2", also manufactured by Specialty Coating Systems, of Indianapolis, Ind.

Rather than parylene polymers, the insulating layers 40K can be an oxide, such as $SiO_2$, formed by a growth process by exposure of the substrate 12K to an $O_2$ atmosphere at an elevated temperature (e.g., 950° C.). Alternately, the insulating layers 40K can comprise an electrically insulating material, such as an oxide or a nitride, deposited using a deposition process such as CVD, or a polymer material deposited using a suitable deposition process such as screen printing. In this case, if the insulating material completely fills the openings 61K, a subsequent laser drilling step, substantially as previously described, may be required to re-open the openings 61K.

Figure 6E:
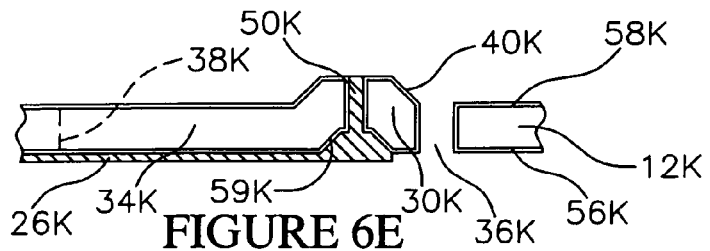
Figure 6F:
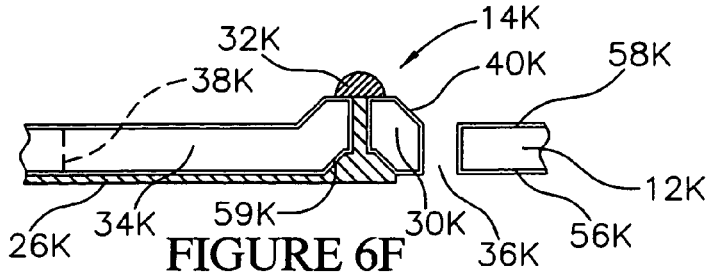

Next, as shown in FIG. 6E, the openings 61K are at least partially filled with a conductive material to form the conductive vias 50K. In addition, the conductive material fills the recesses 59K. The conductive material can comprise a highly conductive metal, such as aluminum, titanium, nickel, iridium, copper, gold, tungsten, silver, platinum, palladium, tantalum, molybdenum, tin, zinc and alloys of these metals. The above metals can be deposited within the openings 61K using a deposition process, such as electroless deposition, CVD, or electrolytic deposition. Alternately a solder metal can be screen printed and drawn into the openings 61K with capillary action.

Rather than being a metal, the conductive material can comprise a conductive polymer, such as a metal filled silicone, or an isotropic epoxy. Another suitable conductive polymer is a nano-particle paste or ink, having metal nanoparticles made of a highly conductive metal, such as aluminum. Nano-particle conductive polymers are commercially available from Superior Micropowders, of Albuquerque, N. Mex.

The openings 61K can also be formed using the laser machining processes disclosed in U.S. Pat. No. 6,107,109 to Akram et al, U.S. Pat. No. 6,114,240 to Akram et al., and U.S. Pat. No. 6,294,837 B1 to Akram et al., all of which are incorporated herein by reference. Rather than a laser machining processes, the conductive vias 61K can be formed using an etch mask and a suitable etchant. As another alternative, the conductive vias 61K can be formed as described in U.S. Pat. No. 6,313,531 B1 to Geusic et al., which is incorporated herein by reference.

As also shown in FIG. 6E, the conductors 26K can be formed on the back side 56K in electrical communication with the conductive vias 50K. The conductors 26K can be formed using a subtractive process (e.g., etching) or an additive process (e.g., sputtering, or a combination of sputtering and plating) as is known in the art. One suitable process is described in U.S. Pat. No. 5,851,911 to Farnworth, which is incorporated herein by reference.

Next, as shown in FIG. 6F, the conductive bumps 32K are formed on the circuit side 58K in physical and electrical contact with the conductive vias 50K. The conductive bumps 32K can be formed using a bonding process, or a deposition process. For example, the conductive bumps 32K can comprise metal bumps deposited using a suitable deposition process, such as stenciling and reflow of a solder alloy. Also, rather than being formed of solder, the conductive bumps 32K can comprise another metal, or a conductive polymer material. The conductive bumps 32K can also be formed by electrolytic deposition, by electroless deposition, or by bonding pre-fabricated balls.

Referring to FIG. 7A, a wafer level testing system 60W incorporating the wafer level interconnect 10, and configured to test the semiconductor wafer 16 is illustrated. As shown in FIG. 7B, the wafer 16 includes a plurality of components 18, such as dice or packages. In addition, each component 18 includes a plurality of component contacts 22, such as bond pads, redistribution pads or test pads, in electrical communication with the integrated circuits contained on the component 18.

The testing system 60W includes a testing apparatus 62, and test circuitry 28 in electrical communication with the wafer level interconnect 10. The testing apparatus 62 can comprise a conventional wafer probe handler, or probe tester, modified for use with the interconnect 10. Wafer probe handlers and associated test equipment are commercially available from Electroglass, Advantest, Teradyne, Megatest, Hewlett-Packard and others. In this system 60W, the interconnect 10 takes the place of a conventional probe card. The test circuitry 28 is adapted to apply test signals to the integrated circuits on the components 18 and to analyze the resultant signals. Test circuitry 28 is commercially available from the above manufacturers as well as others.

The interconnect 10 includes the contacts 14, which as previously described, are configured to make temporary electrical connections with the component contacts 22 on the wafer 16 for applying test signals to the components 18. Alternately, the interconnect 10 can include any of the previously described interconnect contacts 14A, 14B, 14C, 14D, 14E, 14F, 14G, 14H, 14I, 14J, 14K, 14L, 14M, 14N or 14O.

The interconnect 10 is mounted on a compressible member 64 to a rigid base 66. The compressible member 64 can comprise a compressible, elastomeric material, such as rubber, silicone, polyimide or epoxy. The compressible member allows the spring segments 34 of the interconnect contacts 14 to flex, as indicated by the double headed arrow 80 (FIG. 7C), and to help generate contact forces F (FIG. 7C) between the conductive bumps 32 and the component contacts 22. The compressible member 64 can comprise a curable adhesive material, which also functions to attach the back side of the interconnect 10 to the base 66. Alternately, the compressible member 64 can comprise a sheet of material placed between the back side of the interconnect 10 and the base 66.

As another alternative the compressible member 64 can be eliminated and the interconnect 10 mounted to the base 66 such that the spring segments 34 are free to flex without interference. For example the interconnect 10 could be mounted to a peripheral spacer attached to the base 66.

The testing apparatus 62 also includes a wafer chuck 76 configured to support and move the wafer 16 in X, Y and Z directions as required, such that the interconnect contacts 14 align with, and make physical and electrical contact with all of the component contacts 22 on the wafer 16 at the same time. Test signals can then be selectively applied and electronically switched as required, to selected components 18 and component contacts 22. Alternately, the wafer chuck 76 can be used to step the wafer 16, so that the components 18 can be tested in selected groups, or one at a time.

The base 66 can comprise ceramic, plastic, or a glass filled resin. As shown in FIG. 7A, the base 66 includes bond pads 68, and wires 70 wire bonded to the bond pads 68. The wires 70 are also wire bonded to the edge contacts 24 on the interconnect 10, and are thus establish electrical communication between the interconnect contacts 14 and the bond pads 68. The base 66 also includes internal conductors 72 in electrical communication with the bond pads 68, and land pads 74 in electrical communication with the conductors 72.

As also shown in FIG. 7A, the interconnect 10 and the base 66 can mount to a probe card fixture 78 of the testing apparatus 62. The probe card fixture 78 can be similar in construction to a conventional probe card fixture commercially available from manufacturers such as Packard Hughes Interconnect and Wentworth Laboratories. The probe card fixture 78 can be formed of an electrically insulating material such as FR-4 or ceramic. In addition, the testing apparatus 62 can include spring loaded electrical connectors 82 associated with the probe card fixture 78. The spring loaded electrical connectors 82 are in electrical communication with the test circuitry 28.

The spring loaded electrical connectors 82 can be formed in a variety of configurations. One suitable configuration is known as a "POGO PIN" connector. This type of electrical connector includes a spring loaded pin adapted to contact and press against a flat surface to form an electrical connection. Pogo pin connectors are manufactured by Pogo Instruments, Inc., Kansas City, Kans. The spring loaded electrical connectors 82 can also comprise wires, pins or cables formed as spring segments or other resilient members.

The spring loaded electrical connectors 82 are configured to electrically contact the land pads 74 on the base 66. This arrangement provides separate electrical paths from the test circuitry 28, through the spring loaded electrical connectors 82, through the land pads 74, through the conductors 72, through the bond pads 68, through the wires 70, through the edge contacts 24, through the conductors 26, and through the contacts 14 to the component contacts 22. During a test procedure, test signals can be applied to the integrated circuits on the components 18 using these separate electrical paths. Other mounting arrangements for the interconnect 10 are described in U.S. Pat. No. 6,275,052 B1 to Hembree et al., which is incorporated herein by reference.

Referring to FIG. 7D, the interconnect 10 can be constructed with interconnect contacts 14L (FIG. 3C) configured to electrically engage bumped component contacts 22B, such as solder bumps or balls. In this case, the plated recesses 52L retain and electrically engage the bumped component contacts 22B.

Referring to FIG. 7E, the interconnect 10 can be constructed with interconnect contacts 14N (FIG. 3E) configured to electrically engage bumped component contacts 22B, such as solder bumps or balls. In this case, the pointed or bladed conductive bumps 32N of the interconnect contacts 14N penetrate the bumped component contacts 22B.

Figure 7F:
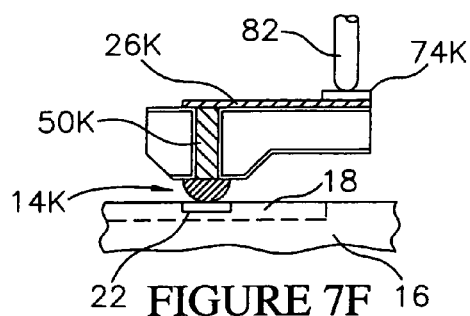
FIG. 7F is an enlarged schematic cross sectional view equivalent to FIG. 7C illustrating the alternate embodiment interconnect contact of FIG. 3B engaging a component contact on the wafer and a back side electrical connection to the interconnect.

Referring to FIG. 7F, the interconnect 10 can be constructed with interconnect contacts 14K (FIG. 3B) configured to electrically engage the component contacts 22B. In this case, the conductive vias 50K and back side conductors 26K can be in electrical communication with back side land pads 74K. In addition, the spring loaded electrical connectors 82 of the testing apparatus 62 can make back side electrical connections to the land pads 74K.

Referring to FIGS. 8A–8C, a die level interconnect 10D is illustrated. The die level interconnect 10D is configured to make temporary electrical connections with components 18 which have been singulated from the wafer 16, and are in discrete form. For example, the components 18 can comprise individual semiconductor dice or packages. As such, the interconnect 10D has a peripheral outline that is about the same as the footprint of a component 18.

The interconnect 10D includes a pattern of interconnect contacts 14P configured to electrically engage bumped component contacts 22B (FIG. 9A) on the components 18. Alternately, the interconnect 10D can include any of the previously described interconnect contacts 14, 14A, 14B, 14C, 14D, 14E, 14F, 14G, 14H, 14I, 14J, 14K, 14L, 14M, 14N or 14O.

Each interconnect contact 14P includes a plated recess 52P (FIG. 8B) configured to retain and electrically engage a bumped component contact 22B. In addition, each plated recess 52P is in electrical communication with a conductive via 50P (FIG. 8C), and a terminal contact 84P (FIG. 8C) on the back side 56P of the interconnect 10D. Further, each interconnect contact 14P includes shaped openings 44P in substrate 12P, which allow the plated recess 52P to flex and exert a spring force substantially as previously described.

Referring to FIGS. 9A–9C, a die level test system 60D incorporating a die level interconnect 10D constructed in accordance with the invention is illustrated. The test system 60D includes a test carrier 86 configured to temporarily package the semiconductor components 18 for test and burn-in. The semiconductor components 18 include bumped component contacts 22B in electrical communication with the integrated circuits contained on the components 18.

The test carrier 86 includes four of the die level interconnects 10D, each of which is configured to electrically engage a component 18. Specifically, the interconnects 10D include interconnect contacts 14P, as previously described, configured to make temporary electrical connections with the bumped component contacts 22B on the components 18. The interconnects 10D also include terminal contacts 84P configured to electrically engage mating electrical connectors (not shown) on a test apparatus 90 (FIG. 9A), such as a burn-in board.

The test apparatus 90 includes, or is in electrical communication with test circuitry 92 (FIG. 9A), configured to apply test signals to the integrated circuits contained on the components 18, and to analyze the resultant signals. The test circuitry 92 transmits the test signals through the terminal contacts 84P and the interconnect contacts 14P on the interconnects 10D to the bumped component contacts 22B on the components 18.

The test carrier 86 also includes a force applying mechanism 88 configured to bias the components 18 against the interconnects 10D, and an alignment member 94 configured to align the bumped component contacts 22B on the components 18, to the interconnect contacts 14P on the interconnects 10D. The alignment member 94 includes openings 96 configured to contact the peripheral edges of the components 18 to guide the components 18 onto the contacts 14P. The alignment member 94 can be constructed, as described in U.S. Pat. No. 5,559,444, to Farnworth et al. which is incorporated herein by reference. Alternately, the alignment member 94 can be eliminated and optical alignment techniques can be employed to align the components 18.

As shown in FIGS. 9A and 9B, the force applying mechanism 88 includes a clamp member 98 which attaches to the interconnects 10D, and a plurality of biasing members 100 for pressing the components 18 against the contacts 14P. In the illustrative embodiment, the biasing members 100 comprise elastomeric blocks formed of a polymer material such as silicone, butyl rubber, flourosilicone, or polyimide. Alternately the biasing members 100 can comprise steel leaf springs. The clamp member 98 includes tabs 102 for engaging the interconnects 10D to secure the clamp member 98 to the interconnects 10D. In the illustrative embodiment, the clamp member 98 attaches directly to the interconnects 10D, which are configured to form a base for the test carrier 86. However, the test carrier 86 can include a separate base, and one or more interconnects 10D can be mounted to the base as described in U.S. Pat. No. 5,519,332 to Wood et al.; U.S. Pat. No. 5,541,525 to Wood et al.; U.S. Pat. No. 5,815,000 to Farnworth et al.; and U.S. Pat. No. 5,783,461 to Hembree, all of which are incorporated herein by reference.

Thus the invention provides an improved interconnect for semiconductor components, test systems incorporating the interconnect, a test method using the interconnect, and methods for fabricating the interconnect. While the invention has been described with reference to certain preferred embodiments, as will be apparent to those skilled in the art, certain changes and modifications can be made without departing from the scope of the invention as defined by the following claims.

What is claimed is:

1. An interconnect for a semiconductor component having a component contact comprising:
   a semiconductor substrate; and
   an interconnect contact on the substrate comprising a portion of the substrate, a conductive bump on the portion configured to electrically engage the component contact, and a plurality of spring segments attached to the portion comprising spring segment portions of the substrate defined by a plurality of shaped openings through the substrate.

2. The interconnect of claim 1 wherein the portion comprises a raised portion of the substrate.

3. The interconnect of claim 1 wherein the shaped openings are generally square shaped.

4. The interconnect of claim 1 wherein the shaped openings are generally arcuately shaped.

5. The interconnect of claim 1 wherein the shaped openings comprise arcuate grooves.

6. The interconnect of claim 1 further comprising a conductor on one of the spring segments in electrical communication with the conductive bump.

7. An interconnect for a semiconductor component having a component contact comprising:
   a semiconductor substrate; and
   an interconnect contact on the substrate comprising a portion of the substrate, a conductive bump on the portion configured to electrically engage the component contact, and a spring segment attached to the portion defined by a pair of nested grooves through the substrate.

8. The interconnect of claim 7 wherein the portion comprises a raised portion of the substrate.

9. The interconnect of claim 7 wherein the nested grooves include a first groove and a second groove having a length of from 0.25 to 0.75 that of the first groove.

10. An interconnect for a semiconductor component having a component contact comprising:
    a semiconductor substrate; and
    an interconnect contact on the substrate comprising a portion of the substrate, a conductive bump on the portion configured to electrically engage the component contact, and a bifurcated spring segment attached to the portion defined by a groove the substrate and a shaped opening through the substrate.

11. The interconnect of claim 10 wherein the portion comprises a raised portion of the substrate.

12. The interconnect of claim 10 further comprising a conductor on the spring segment in electrical communication with the conductive bump.

13. An interconnect for a semiconductor component having a component contact comprising:
    a semiconductor substrate; and
    an interconnect contact on the substrate comprising a portion of the substrate, a conductive bump on the portion configured to electrically engage the component contact, and at least two spring segments attached to the portion comprising shaped portions of the substrate.

14. The interconnect of claim 13 wherein the portion comprises a raised portion of the substrate.

15. The interconnect of claim 13 wherein the shaped portions have a serpentine shape.

16. The interconnect of claim 13 wherein the shaped portions have an orthogonal shape.

17. The interconnect of claim 13 further comprising a conductor on one of the spring segments in electrical communication with the conductive bump.

18. An interconnect for a semiconductor component having a component contact comprising:
    a semiconductor substrate; and
    an interconnect contact on the substrate comprising a portion of the substrate, a conductive bump on the portion configured to electrically engage the component contact, and a plurality of spring segments attached to the portion comprising portions of the substrate defined by a plurality of arcuate grooves or arcuate shaped openings through the substrate.

19. The interconnect of claim 18 wherein the portion comprises a raised portion of the substrate.

20. The interconnect of claim 18 further comprising a conductive via in the substrate in electrical communication with the conductive bump and a conductor on a back side of the substrate in electrical communication with the conductive via.

21. An interconnect for a semiconductor component having a bumped component contact comprising:
    a semiconductor substrate; and
    an interconnect contact on the substrate comprising a spring segment comprising a portion of the substrate defined by a groove through the substrate, and a plated recess on the spring segment configured to retain and electrically engage the bumped component contact.

22. The interconnect of claim 21 further comprising a conductive via in the substrate in electrical communication with the plated recess and a conductor on a back side of the substrate in electrical communication with the conductive via.

23. The interconnect of claim 21 further comprising a conductor on a circuit side of the substrate in electrical communication with the plated recess.

24. A system for testing a semiconductor component having a plurality of component contacts comprising:
    a test circuitry configured to apply test signals to the components;
    a test carrier configured to retain the component;
    an interconnect on the test carrier comprising a semiconductor substrate and a plurality of interconnect contacts on the substrate in electrical communication with the test circuitry and configured to electrically engage the component contacts, the interconnect contacts comprising hinged spring segment portions of the substrate defined by a plurality of grooves or shaped openings through the substrate.

25. The system of claim 24 wherein the test carrier comprises a force applying mechanism configured to bias the component against the interconnect.

26. The system of claim 24 wherein the interconnect includes a conductive via in the substrate in electrical communication with the interconnect contacts and a terminal contact on the conductive via.

27. The system of claim 24 wherein each groove has a generally C-shape rotated 180°.

28. The system of claim 24 wherein each groove has an arcuate shape.

29. The system of claim 24 wherein each groove has a generally C-shape rotated 180° and includes flared terminal portions.

30. The system of claim 24 wherein a length of each groove is from 2 to 160 times greater than a width thereof.

31. The system of claim 24 wherein each interconnect contact comprises a projection configured to penetrate a component contact.

32. The system of claim 24 wherein each interconnect contact comprises a plated recess configured to retain a component contact.

* * * * *